US008842855B2

(12) United States Patent
Adachi

(10) Patent No.: US 8,842,855 B2
(45) Date of Patent: Sep. 23, 2014

(54) SOUND VOLUME CONTROL CIRCUIT

(75) Inventor: Koichiro Adachi, Takarazuka (JP)

(73) Assignee: Ricoh Company, Ltd., Tokyo (JP)

(*) Notice: Subject to any disclaimer, the term of this patent is extended or adjusted under 35 U.S.C. 154(b) by 290 days.

(21) Appl. No.: 13/343,206

(22) Filed: Jan. 4, 2012

(65) Prior Publication Data

US 2012/0177227 A1    Jul. 12, 2012

(30) Foreign Application Priority Data

Jan. 12, 2011 (JP) ................................. 2011-003576

(51) Int. Cl.
*H03G 3/00* (2006.01)
*H03M 1/66* (2006.01)
*H03M 1/78* (2006.01)
*H03F 99/00* (2009.01)

(52) U.S. Cl.
USPC ............ 381/107; 341/145; 341/154; 381/120

(58) Field of Classification Search
CPC .................. H03M 1/00; H03M 1/765; H03M 2201/4233; H03M 2201/4425; H03M 2201/4262; H03M 1/785; H03M 1/682; H03G 3/001; H03G 3/32; H03G 3/3005; H03G 3/3089; H03G 7/007; H03F 3/68; H03F 2200/03; H03F 3/181; H03F 3/217; H03F 3/72
USPC .................. 381/104, 108, 109, 120, 121, 107; 330/129, 254, 278, 284, 286, 86; 455/232.1; 341/144, 145, 154
See application file for complete search history.

(56) References Cited

U.S. PATENT DOCUMENTS

| 5,408,199 A | * | 4/1995 | Nagano et al. ................. 330/284 |
| 6,127,893 A | * | 10/2000 | Llewellyn et al. ............ 330/284 |
| 6,198,349 B1 | * | 3/2001 | Kanno et al. ................... 330/282 |
| 6,693,491 B1 | * | 2/2004 | Delano .......................... 330/282 |
| 6,778,120 B2 | * | 8/2004 | Matsui ........................... 341/145 |
| 7,102,441 B2 | * | 9/2006 | Lee et al. ....................... 330/284 |
| 7,162,029 B2 | * | 1/2007 | Soman et al. ............ 379/399.02 |
| 7,639,076 B2 | * | 12/2009 | Moon et al. ...................... 330/86 |
| 7,876,151 B1 | * | 1/2011 | Terry .............................. 330/86 |

FOREIGN PATENT DOCUMENTS

| JP | 2002-26678 | 1/2002 |
| JP | 2005-117489 | 4/2005 |
| JP | 2008-109560 | 5/2008 |

* cited by examiner

*Primary Examiner* — Vivian Chin
*Assistant Examiner* — David Ton
(74) *Attorney, Agent, or Firm* — Cooper & Dunham LLP

(57) ABSTRACT

A sound volume control circuit includes: a first operational amplifier; a variable resistor circuit connected between an output and an inverting input of the first operational amplifier and having a plurality of resistance values; an R-2R ladder circuit connected between a voltage source of an input voltage; and a control circuit controlling the variable resistor circuit and the R-2R ladder circuit; wherein when changing a resistance value of the variable resistor circuit from a first resistance value to a second resistance value, so as to change the output voltage in a step size where a difference between the output voltage corresponding to the first resistance value and the output voltage corresponding to the second resistance value is further segmented, the control circuit changes the magnitude of the electric current flowing to the variable resistor circuit by use of the R-2R ladder circuit.

5 Claims, 2 Drawing Sheets

SOUND VOLUME CONTROL CIRCUIT

CROSS-REFERENCE TO RELATED APPLICATIONS

The present application is based on and claims priority from Japanese patent application number 2011-003576, filed on Jan. 12, 2011, the disclosure of which is hereby incorporated by reference herein in its entirety.

BACKGROUND

The present invention relates to a sound volume control circuit that controls sound volume by digitally changing an output voltage.

A headphone amplifier, or a speaker amplifier, has a function that controls sound volume. For example, a sound signal processor disclosed in Japanese Patent Application Publication number 2008-109560, and the like are known.

FIG. 2 is a block diagram illustrating a configuration of a sound volume control circuit according to a conventional technique. An inverting input of an operational amplifier 1 is connected to a voltage source of an input voltage VIN via a resistor R0, and a non-inverting input of the operational amplifier 1 is connected to a voltage source of a reference voltage VREF. Between an output and the inverting input of the operational amplifier 1, a digital variable resistor circuit 2 that controls sound volume (that is, which discretely changes a resistance value) is connected in a negative feedback manner. The variable resistor circuit 2 includes a plurality of resistors R1 to Rm that have different resistance values to each other, and are connected in parallel. The resistors R1 to Rm are connected to switches SWa1 to Swam, respectively. The variable resistor circuit 2 operates as a 1-dB-step volume device (for example, 0 dB when the switch SWa is on, −1 dB when the switch SWa2 is on, −39 dB when the switch SWam−1 is on, −40 dB when the switch SWam is on, and so on), for example, by turning on any one of the switches SWa1 to Swam connected respectively to the resistors R1 to Rm. The sound volume control circuit in FIG. 2 switches on/off the switches SWa1 to SWam to change a resistance value of the variable resistor circuit 2 (hereinafter, referred to as RVOL) according to a desired sound volume setting, and therefore an output voltage VOUT is changed.

In the digital sound volume control circuit as illustrated in FIG. 2, in a case of outputting a signal, when the resistance value RVOL of the variable resistor circuit 2 is changed, due to this change, fluctuation of the output voltage VOUT occurs and zipper noise appears. The larger the amplitude of the signal outputting, the larger a voltage difference before and after changing the resistance value RVOL of the variable resistor circuit 2 becomes, and the more prominent the zipper noise becomes.

In order to avoid the zipper noise, it is necessary to make a step size of the resistance value RVOL of the variable resistor circuit 2 smaller. Therefore, an additional resistor and switch are needed per different resistance value RVOL, and a die size increases. Accordingly, a trade-off occurs between the suppression of the zipper noise and the increase of the die size. In addition, there may be a case where problems such as deterioration of a ripple removal rate and the like occur, due to the increase of the number of switches.

SUMMARY

An object of the present invention is to solve the above-described problems, and provide a sound volume control circuit that controls sound volume by digitally changing an output voltage, and in particular, a sound volume control circuit that suppresses an occurrence of zipper noise without significantly increasing a die size.

In order to achieve the above object, the embodiment of the present invention provides: a sound volume control circuit that controls sound volume by digitally changing an output voltage comprising: a first operational amplifier including: an inverting input; a non-inverting input connected to a voltage source of a reference voltage; and an output that outputs the output voltage; a variable resistor circuit that is connected between the output and the inverting input and has a plurality of resistance values; an R-2R ladder circuit that is connected between a voltage source of an input voltage and changes the magnitude of electric current flowing to the variable resistor circuit; and a control circuit that controls the variable resistor circuit and the R-2R ladder circuit; wherein when changing a resistance value of the variable resistor circuit from a first resistance value to a second resistance value, so as to change the output voltage in a step size where a difference between the output voltage corresponding to the first resistance value and the output voltage corresponding to the second resistance value is further segmented, the control circuit changes the magnitude of the electric current flowing to the variable resistor circuit by use of the R-2R ladder circuit.

DETAILED DESCRIPTION OF THE PREFERRED EMBODIMENTS

Figure 1:
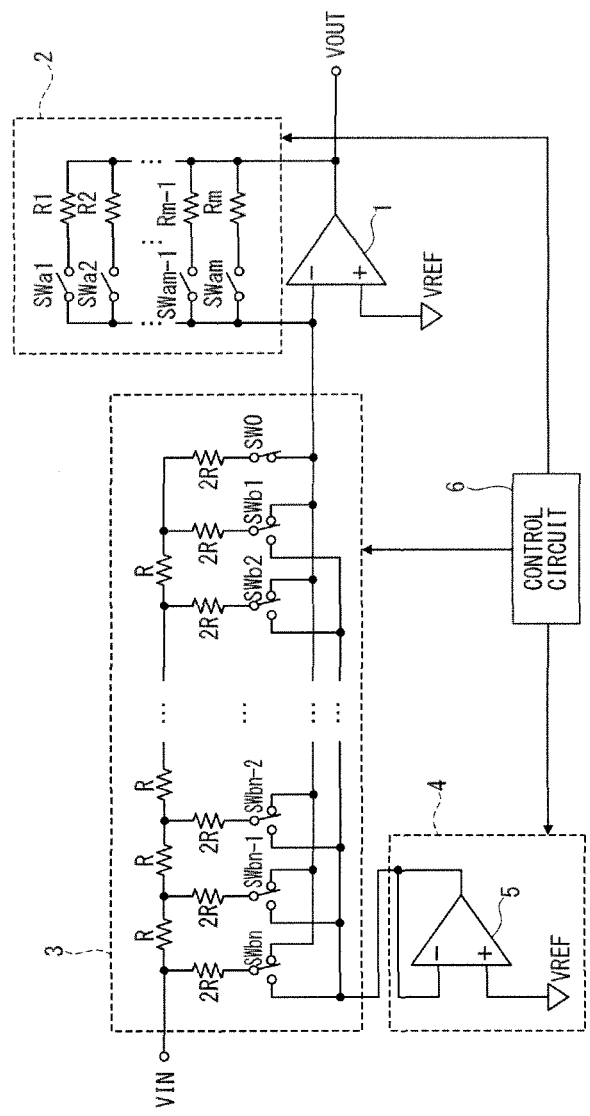
FIG. 1 is a block diagram illustrating a configuration of a sound volume control circuit according to an embodiment of the present invention.

FIG. 1 is a block diagram illustrating a configuration of a sound volume control circuit according to an embodiment of the present invention. The sound volume control circuit according to the present embodiment has an R-2R ladder circuit 3 in place of a resistor R0 of a sound volume control circuit in FIG. 2.

Figure 2:
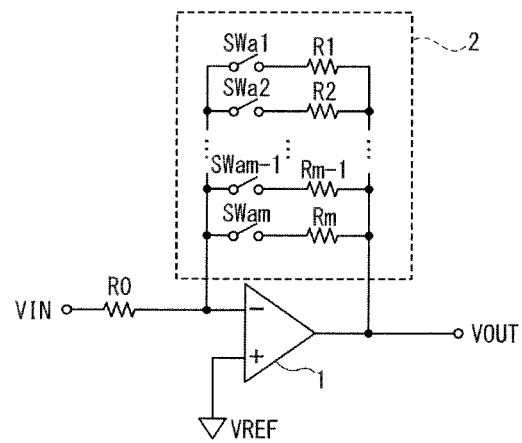
FIG. 2 is a block diagram illustrating a configuration of a sound volume control circuit according to a conventional technique.

The sound volume control circuit according to the present embodiment includes an operational amplifier 1 (first operational amplifier) and a variable resistor circuit 2 similar to those in FIG. 2. The sound volume control circuit further includes an R-2R ladder circuit 3, a voltage buffer circuit 4, and a control circuit 6. The R-2R ladder circuit 3 is connected between an inverting input of the operational amplifier 1 and a voltage source of an input voltage VIN. The voltage buffer circuit 4 buffers a reference voltage VREF supplied to the R-2R ladder circuit 3. The control circuit 6 controls operations of the variable resistor circuit 2, the R-2R ladder circuit 3, and the voltage buffer circuit 4. The voltage buffer circuit 4 has an operational amplifier 5 (second operational amplifier), for example. Substantially, similarly to a case of the sound volume control circuit in FIG. 2, according to a desired sound volume setting, an output voltage VOUT of the sound volume control circuit is changed by switching on/off switches of the variable resistor circuit 2 (in the case of the sound volume control circuit in FIG. 2, the switches SWa1 to SWam) and changing a resistance value RVOL of the variable resistor circuit 2. In the sound volume control circuit according to the present embodiment, in a case of changing the resistance value RVOL of the variable resistor circuit 2, the magnitude of electric current flowing to the variable resistor circuit 2 is changed by use of the R-2R ladder circuit 3, so as to change the output value VOUT in a step size where a difference between the output voltage corresponding to a resistance value before changing and the output voltage corresponding to a resistance value after changing is further segmented.

The R-2R ladder circuit 3 is an R-2R ladder circuit known as a D/A convertor, and in which n−1 resistors (first resistors) having a predetermined resistance value R (third resistance value), n+1 resistors having a resistance value 2R (fourth resistor) that is twice as large as the predetermined resistance value R, and n switches SWb1 to SWbn (first switches) are connected in a ladder-like manner. That is, in the R-2R ladder circuit 3, a resistor chain of n−1 resistors having the resistance value R and one resistor (second resistor) having the resistance value 2R that are series-connected is provided between the voltage source of the input voltage VIN and the inverting input of the operational amplifier 1, and the resistor having the resistance value 2R of the resistor chain is provided closest to the inverting input of the operational amplifier 1. Preferably, a switch SW0 (second switch) is further provided between the resistor having the resistance value 2R of the resistor chain and the inverting input of the operational amplifier 1. n resistors (third resistors) having the resistance value 2R branch from the resistor chain, and each of the branched resistors is connected to either the inverting input of the operational amplifier 1 or the voltage buffer circuit 4 by the switches SWb1 to SWbn. The switches SWb1 to SWbn, preferably, are further in a state of being connected to neither the inverting input of the operational amplifier 1 nor the voltage buffer circuit 4. Each of n switches SWb1 to SWbn is connected to either the inverting input of the operational amplifier 1 or the voltage buffer circuit 4, so that magnitude of electric current flowing to a side of the inverting input of the operational amplifier 1 gradually changes in a linear step by $\frac{1}{2^n}$.

Hereinafter, an operation example of the sound volume control circuit according to the present embodiment will be explained. In order to simplify the explanation, it is assumed that the amplitude of an input signal is stable throughout the operation. When the resistance value RVOL of the variable resistor circuit 2 is set and maintained at a predetermined value, the switch SW0 of the R-2R ladder circuit 3 is turned on, and all of the switches SWb1 to SWbn are connected to the inverting input of the operational amplifier 1. Since none of the switches SWb1 to SWbn is connected to the voltage buffer circuit 4, it is possible to turn off the operational amplifier 5 of the voltage buffer circuit 4 and reduce electric current consumption. When the input voltage VIN and the reference voltage VREF are applied to the sound volume control circuit, the switch SW0 of the R-2R ladder circuit 3 is turned on, and all of the switches SWb1 to SWbn are connected to the inverting input of the operational amplifier 1, electric current I1 flowing to the side of the inverting input of the operational amplifier 1 is expressed by the following expression.

$$I1=(VIN-VREF)/R \quad \text{[Expression 1]}$$

The output voltage VOUT obtained by the flow of the electric current I1 to the variable resistor circuit 2 having the resistance value RVOL is expressed by the following expression.

$$VOUT=VREF-(RVOL \times I1) \quad \text{[Expression 2]}$$

Next, a case of reducing the resistance value RVOL of the variable resistor circuit 2 will be explained. A case of switching from a resistor R1 having a predetermined resistance value RVOL1 to a resistor R2 having a resistance value RVOL2 which is large next to the resistance value RVOL1 is assumed. In this case, the output voltage VOUT finally changes from an output voltage VOUT1 corresponding to the resistance value RVOL1 to an output voltage VOUT2 corresponding to the resistance value RVOL2.

$$VOUT1=VREF-(RVOL1 \times I1) \quad \text{[Expression 3]}$$

$$VOUT2=VREF-(RVOL2 \times I1) \quad \text{[Expression 4]}$$

The sound volume control circuit according to the present embodiment changes the electric current I1 flowing to the side of the inverting input of the operational amplifier 1 to electric current I2 expressed by the following expression, Expression 5, by use of the R-2R ladder circuit 3, so as to change the output voltage VOUT1 to the output voltage VOUT2 beforehand, before changing the resistance value of the variable resistor circuit 2 from the resistance value RVOL1 to the resistance value RVOL2.

$$I2=I1 \times RVOL2/RVOL1 \quad \text{[Expression 5]}$$

Hereinafter, operation of the R-2R ladder circuit 3 to achieve such a change of electric current will be explained. Before changing the resistance value RVOL of the variable resistor circuit 2, firstly, the operational amplifier 5 of the voltage buffer circuit 4 is turned on, and then, so as to gradually reduce the electric current I1 in the linear step by $I1/2^n$, a combination of a connection state of each of the switches SWb1 to SWbn of the R-2R ladder circuit 3 is sequentially switched. To each of the switches SWb1 to SWbn, each electric current $I1/2^n$, $I1/2^{n-1}$, ..., $I1/2^3$, $I1/2^2$, $I1/2$ flows, respectively. Therefore, when a state where a switch SWbi ($1 \leq i \leq n$) is connected to the inverting input of the operational amplifier 1 is taken as a (i)=0, and a state where the switch SWbi is connected to the voltage buffer circuit 4 is taken as a (i)=1, electric current I flowing to the side of the inverting input of the operational amplifier 1 is expressed by the following expression.

$$I=I1-(I1/2 \times a(n)+I1/2^2 \times a(n-1)+I1/2^3 \times a(n-2)+ \ldots +I1/2^n \times a(1)) \quad \text{[Expression 6]}$$

A time for switching the combination of the connection state of each of the switches SWb1 to SWbn needs to be made sufficiently shorter than a time for one cycle of a signal having an upper limit frequency 20 KHz of an audio band range.

Thus, by sequentially switching the combination of the connection state of each of the switches SWb1 to SWbn, the electric current flowing to the side of the inverting input of the operational amplifier 1 is gradually reduced from the electric current I1 to the electric current I2 in the linear step by $I1/2^n$. As the electric current flowing to the side of the inverting input of the operational amplifier 1 is reduced, the output voltage VOUT changes in a step size where the difference between the output voltage VOUT1 and the output voltage VOUT2 is further segmented, and when the electric current reaches the electric current I2, the output voltage VOUT becomes the output voltage VOUT2.

$$VOUT2=VREF-(RVOL1 \times I2) \quad \text{[Expression 7]}$$

When the output voltage VOUT becomes the output voltage VOUT2, all of the switches SWb1 to SWbn of the R-2R ladder circuit 3 are connected to the inverting input of the operational amplifier 1 (this makes the electric current flowing to the side of the inverting input of the operational amplifier 1 become the electric current I2 from the electric current I1). At the same time, the resistance value of the variable resistor circuit 2 changes from the resistance value RVOL1 to the resistance value RVOL2. This switching is expressed by the following expression by use of Expression 7 and Expression 4.

$$VOUT2=VREF-(RVOL1 \times I2)=VREF-(RVOL2 \times I1) \quad \text{[Expression 8]}$$

Next, in order to switch from the resistor R2 having the resistance value RVOL2 to a resistor having a large resistance value next to the resistance value RVOL2, a similar operation is repeated, and afterwards, the operation is repeated until the resistance value RVOL of the variable resistor circuit 2 reaches a value according to the desired sound volume setting.

On the other hand, in a case of increasing the resistance value RVOL of the variable resistor circuit 2, the opposite operation to the above operation is performed. A case of switching from the resistor R2 having the resistance value RVOL2 to the resistor R1 having the resistance value RVOL1, which is small next to the resistance value RVOL2, is assumed. Firstly, the operational amplifier 5 of the voltage buffer circuit 4 is turned on, and then, the combination of the connection state of each of the switches SWb1 to SWbn is switched such that the electric current flowing to the side of the inverting input of the operational amplifier 1 becomes the electric current I2 from the electric current I1, and at the same time, the resistance value of the variable resistor circuit 2 is changed from the resistance value RVOL2 to the resistance value RVOL1 (see Expression 5 and Expression 8). Afterwards, the combination of the connection state of each of the switches SWb1 to SWbn is sequentially switched, and thereby the electric current flowing to the side of the inverting input of the operational amplifier 1 is gradually increased from the electric current I2 to the electric current I1 in the linear step by $I1/2^n$. As the electric current flowing to the side of the inverting input of the operational amplifier 1 increases, the output voltage VOUT changes in the step size where the difference between the output voltage VOUT2 and the output voltage VOUT1 is further segmented, and when the electric current reaches the electric current I1, the output voltage VOUT becomes the output voltage VOUT1 (see Expression 3). Next, in order to switch from the resistor R1 having the resistance value RVOL1 to a resistor having a small resistance value next to the resistance value RVOL1, a similar operation is repeated, and afterwards, the operation is repeated until the resistance value RVOL of the variable resistor circuit 2 reaches a value according to the desired sound volume setting.

When muting an output signal, the sound volume control circuit according to the present embodiment operates as follows. Firstly, the above-described operation that reduces the resistance value RVOL of the variable resistor circuit 2 is repeated until the resistance value RVOL becomes a minimum value. When the resistance value RVOL of the variable resistor circuit 2 becomes the minimum value, the switches SWb1 to SWbn are switched to a state of being connected to neither the inverting input of the variable resistor circuit 2 nor the voltage buffer circuit 4, and additionally, the switch SW0 is turned off. At this time, the sound volume control circuit is in a completely muted state. And in addition, at this time, none of the switches SWb1 to SWbn is connected to the voltage buffer circuit 4, therefore it is possible to turn off the operational amplifier 5 of the voltage buffer circuit 4, and reduce electric current consumption. When releasing the muted state, the opposite operation to the above operation is performed.

The control circuit 6, so as to achieve the above-described operation, controls connection states of the switches SWa1 to SWam of the variable resistor circuit 2, controls connection states of the switches SW0, and SWb1 to SWbn of the R-2R ladder circuit 3, and controls on/off of the operational amplifier 5 of the voltage buffer circuit 4.

The larger the number, n, of the switches SWb1 to SWbn (that is, the number of rungs of the R-2R ladder circuit 3), the more segmented step size the electric current flowing to the inverting input of the operational amplifier 1 and the output voltage VOUT can be changed. By increasing the number of rungs of the R-2R ladder circuit 3, it is possible to change the output voltage VOUT of the sound volume control circuit in an extremely segmented step size compared to a sound volume control circuit according to the conventional technique, and suppress an occurrence of the zipper noise. Resistors and switches of the R-2R ladder circuit 3 are needed in accordance with the number of rungs of the R-2R ladder circuit 3; however, the numbers of those are extremely small compared to a case of increasing resistors and switches of the variable resistor circuit 2 in FIG. 2, and it is possible to suppress an increase of a die size. Due to such an effect, the increase of the die size is suppressed to the minimum, and it is possible to achieve the sound volume control circuit in which the zipper noise does not occur.

According to the present embodiment of the present invention, it is possible to provide a sound volume control circuit that controls sound volume by digitally changing output voltage, and in particular, a sound volume control circuit that is capable of suppressing the occurrence of the zipper noise without significantly increasing the die size.

Although the present invention has been described in terms of exemplary embodiments, it is not limited thereto. It should be appreciated that variations may be made in the embodiments described by persons skilled in the art without departing from the scope of the present invention as defined by the following claims.

What is claimed is:

1. A sound volume control circuit that controls sound volume by digitally changing an output voltage comprising:
    a first operational amplifier including: an inverting input; a non-inverting input connected to a voltage source of a reference voltage; and an output that outputs the output voltage;
    a variable resistor circuit that is connected between the output and the inverting input, and has a plurality of resistance values;
    an R-2R ladder circuit that is connected between a voltage source of an input voltage and the inverting input, and changes the magnitude of electric current flowing to the variable resistor circuit,
    the R-2R ladder circuit including:
        a resistor chain that has a plurality of resistors connected in series,
            the resistor chain having: a plurality of first resistors having a third resistance value, respectively; and one second resistor that is provided closest the inverting input and has a fourth resistance value that is twice as large as the third resistance value;
        a plurality of third resistors that has the fourth resistance value, respectively, and is branched from the resistor chain, respectively;
        a plurality of first switches by which the branched plurality of the third resistors is connected to either the inverting input or the voltage source of the reference voltage, respectively; and
        a second switch that is provided between the resistor chain and the inverting input; and
    a control circuit that controls the variable resistor circuit and the R-2R ladder circuit,
    wherein when changing a resistance value of the variable resistor circuit from a first resistance value to a second resistance value, so as to change the output voltage in a step size where a difference between the output voltage corresponding to the first resistance value and the output voltage corresponding the second resistance value is further segmented, the control circuit changes the magnitude of the electric current flowing to the variable resistor circuit by use of the R-2R ladder circuit, and wherein each of the plurality of the first switches further has a state of being connected to neither the inverting input nor the voltage source of the reference voltage, and in a case of muting, the control circuit changes the resistance value of the variable resistor circuit to a minimum value, switches each of the plurality of the first switches to the state of being connected to neither the inverting input nor the voltage source of the reference voltage, and turns oil the second switch.

2. The sound volume control circuit according to claim 1, wherein in a case where the first resistance value is higher than the second resistance value, the control circuit gradually reduces the electric current flowing to the variable resistor circuit by use of the R-2R ladder circuit, and when the output voltage reaches the output voltage corresponding to the second resistance value, the control circuit returns the magnitude of the electric current flowing to the variable resistor circuit to the original magnitude, and at the same time, changes the resistance value of the variable resistor circuit from the first resistance value to the second resistance value.

3. The sound volume control circuit according to claim 1, wherein in a case here the first resistance value is lower than the second resistance value, the control circuit changes the resistance value of the variable resistor circuit from the first resistance value to the second resistance value, and at the same time, reduces the electric current flowing to the variable resistor circuit by use of the R-2R ladder circuit such that the output voltage becomes the output voltage corresponding to the first resistance value, and then gradually increases the electric current flowing to the variable resistor circuit by use of the R-2R ladder circuit until the output voltage reaches the output voltage corresponding to the second resistance value.

4. The sound volume control circuit according to claim 1, wherein the voltage source of the reference voltage connected to the plurality of the first switches includes: a second operational amplifier that buffers the reference voltage.

5. The sound volume control circuit according to claim 4, wherein when none of the plurality of first switches is connected to the voltage source of the reference voltage, the control circuit turns off the second operational amplifier.

\* \* \* \* \*